US 11,777,485 B2

(12) United States Patent
Shrivastava et al.

(10) Patent No.: US 11,777,485 B2
(45) Date of Patent: *Oct. 3, 2023

(54) BYPASS CIRCUITRY TO IMPROVE SWITCHING SPEED

(71) Applicant: pSemi Corporation, San Diego, CA (US)

(72) Inventors: Ravindranath D. Shrivastava, San Diego, CA (US); Simon Willard, Irvine, CA (US); Peter Bacon, New Hampshire, CT (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,725

(22) Filed: Apr. 26, 2022

(65) Prior Publication Data

US 2022/0321113 A1      Oct. 6, 2022

Related U.S. Application Data

(63) Continuation of application No. 17/202,003, filed on Mar. 15, 2021, now Pat. No. 11,329,642.

(51) Int. Cl.
*H03K 17/04* (2006.01)
*H03K 17/0412* (2006.01)

(52) U.S. Cl.
CPC ............... *H03K 17/04123* (2013.01)

(58) Field of Classification Search
CPC ....... H03K 17/04106; H03K 17/04163; H03K 17/04206; H03K 17/063; H03K 17/08104; H03K 17/08122; H03K 17/08142; H03K 17/0822; H03K 17/102; H03K 17/122; H03K 17/13; H03K 17/133; H03K 17/145; H03K 17/161; H03K 17/162; H03K 17/163; H03K 17/164; H03K 17/165; H03K 17/166; H03K 17/167; H03K 17/223; H03K 17/284; H03K 17/687; H03K 17/6871; H03K 17/6872; H03K 17/6874; H03K 17/6877; H03K 17/689; H03K 17/6895;
(Continued)

(56) References Cited

U.S. PATENT DOCUMENTS

| 9,143,124 B2 | 9/2015 | Cam et al. |
| 9,893,722 B2 | 2/2018 | Mokalla |
| 10,461,729 B2 | 10/2019 | Kerr et al. |

(Continued)

FOREIGN PATENT DOCUMENTS

KR      20190053787 A      5/2019

OTHER PUBLICATIONS

Final Office Action for U.S. Appl. No. 17/321,363, filed May 14, 2021 on behalf of pSemi Corporation dated Mar. 15, 2022 15 pages.
(Continued)

*Primary Examiner* — Quan Tra
(74) *Attorney, Agent, or Firm* — Steinfl + Bruno LLP

(57) ABSTRACT

Methods and devices to improve the switching speed of radio frequency FET switch stacks are disclosed. The described methods and devices are based on bypassing drain-sources resistors when the FET switch stack is transitioning from an ON to an OFF state. Several implementations of the disclosed teachings are also presented.

19 Claims, 17 Drawing Sheets

(58) Field of Classification Search
CPC .............. H03K 17/691; H03K 17/693; H03K 2017/6875; H03K 2017/6878
USPC .................................. 327/427, 434; 333/103
See application file for complete search history.

(56) References Cited

U.S. PATENT DOCUMENTS

| | | | |
|---|---|---|---|
| 10,608,623 | B2 | 3/2020 | Kerr et al. |
| 10,897,246 | B2 | 1/2021 | Scott et al. |
| 11,290,001 | B2 | 3/2022 | Zhang et al. |
| 11,329,642 | B1 | 5/2022 | Shrivastava et al. |
| 2013/0027081 | A1 | 1/2013 | Nazarian et al. |
| 2013/0033307 | A1 | 2/2013 | Lin |
| 2016/0329891 | A1 | 11/2016 | Bakalski et al. |
| 2017/0201245 | A1 | 7/2017 | Scott et al. |
| 2017/0302259 | A1 | 10/2017 | Mokalla |
| 2018/0167062 | A1 | 6/2018 | Shanjani et al. |
| 2019/0149142 | A1* | 5/2019 | Scott .................... H03K 17/693 327/109 |
| 2021/0075420 | A1 | 3/2021 | Kovac et al. |

OTHER PUBLICATIONS

International Search Report and Written Opinion for International PCT Application No. PCT/US2022/019586 filed on Mar. 9, 2022, on behalf of pSemi Corporation, dated Jun. 24, 2022. 8 Pages.
Non-Final Office Action for U.S. Appl. No. 17/374,927, filed Jul. 13, 2021 on behalf of pSemi Corporation dated Apr. 14, 2022 9 pages.
Non-Final Office Action for U.S. Appl. No. 17/403,758, filed Aug. 16, 2021, on behalf of pSemi Corporation, dated May 25, 2022. 9 Pages.
Notice of Allowance for U.S. Appl. No. 17/321,363, filed May 14, 2021, on behalf of pSemi Corporation, dated Apr. 28, 2022. 8 Pages.
Notice of Allowance U.S. Appl. No. 17/374,927, filed Jul. 13, 2021, on behalf of pSemi Corporation, dated May 11, 2022. 8 Pages.

* cited by examiner

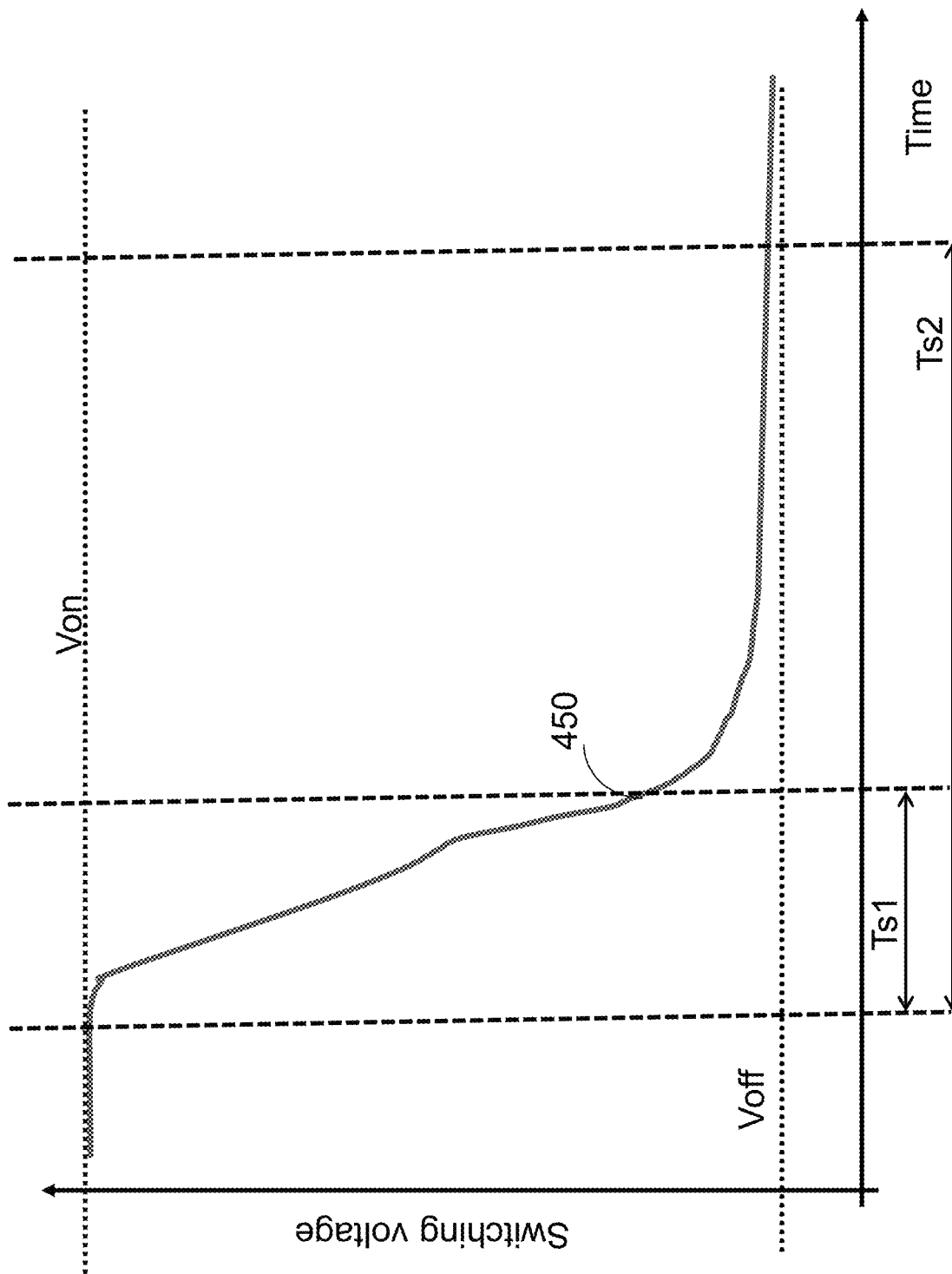

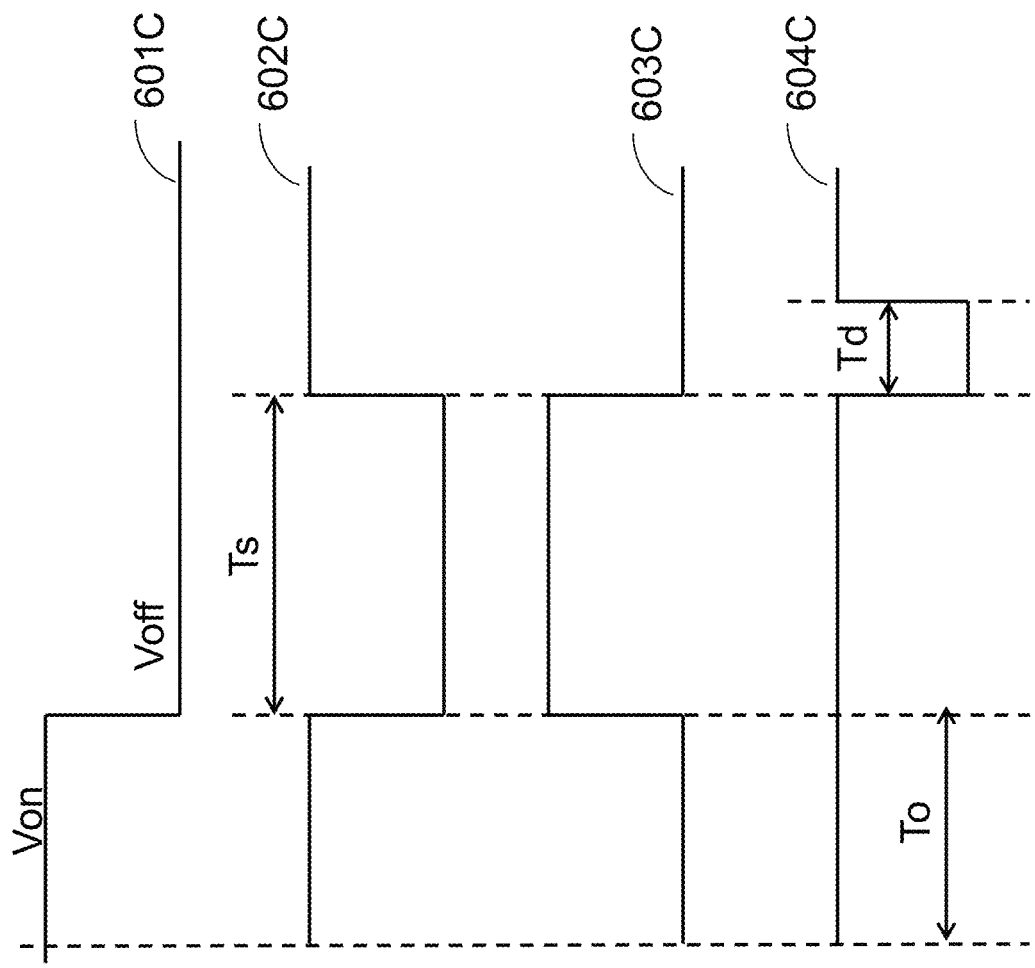

BYPASS CIRCUITRY TO IMPROVE SWITCHING SPEED

The present application is a continuation of U.S. Non-Provisional application Ser. No. 17/202,003 filed on Mar. 15, 2021, now U.S. Pat. No. 11,329,642 to be issued on May 10, 2022, the contents of which are incorporated herein by reference in their entirety.

FIELD

BACKGROUND

FIG. 1A shows a prior art FET switch stack (100A) including transistors (T1, ..., Tm1, Tm2, ..., Tn), drain-source resistors (Rd1, ..., Rdm1, Rdm2, ..., Rdn), common gate bypass switch (140) including gate resistors (Rg1, ..., Rgk) coupled across corresponding gate bypass switches (Sg1, ..., Sgk). Common gate bypass switch (140) is coupled to transistors (T1, ..., Tm1, Tm2, ..., Tn) via gate resistive network (130). Transistors (Tm1, Ym2)) are adjacent transistors. It is well known to the person skilled in the art that using larger gate resistors in FET switch stacks has several advantages such as improved linearity and improved insertion loss. However, the combination of a larger gate resistor in combination with the transistor device gate capacitance will result in a slower transition of the transistors within the FET switch stack from one state (e.g. ON or OFF) to another. As such, gate bypass switches (Sg1, ..., Sgk) may be implemented to bypass corresponding gate resistors during transition and therefore improve the overall transition speed of FET switch stack (100A).

When FET switch stack (100A) is turning from the ON to the OFF state, drain-source resistors (Rd1, ..., Rdm1, Rdm2, ..., Rdn), are in the charging paths of corresponding device gate capacitors (Cg1, ..., Cgm1, Cgm2, ..., Cgn) (not shown in FIG. 1A). The overall switching speed from the ON to OFF state will therefore depend on the RC time constant imposed by a combination of each drain-source resistor with corresponding device gate capacitor. Such switching speed may still not be sufficient due to stringent design requirements of RF circuits implementing FET switches. This is often the case notwithstanding an already improved switching speed due to the gate bypass switches.

In order to further clarify the point mentioned above, reference is also made to FIGS. 1B and 1C, wherein, for the sake of simplicity, only transistor (T1), represented by its gate capacitor (Cg1) serially connected to the corresponding drain-source resistor (Rd1), is shown. In order to turn FET switch stack (100A) of FIG. 1A to the ON state, voltage (Von), e.g. 4V, is applied to input terminal (in). Moreover, in order to turn the FET switch (100A) to the OFF state, voltage (Voff), e.g. −3.4V, is applied to input terminal (in).

With reference to FIG. 1B, when FET switch stack (100A) is transitioning from the ON to the OFF state, switch (Sg1) is in an ON state (i.e. closed) during a certain switching time window (Ts), and the transistor gate capacitor (Cg1) is charged by current (I1) with a time constant substantially equal to Rd1*Cg1. At the steady state, and assuming switch (Sg1) is still in the ON state (i.e. closed), gate capacitor (Cg1) is charged with a voltage which is substantially equal to Voff, e.g. −3.4V, with practically no current flowing through resistor (Rd1). In other words, the gate terminal of transistor (T1), shown as point (G) in FIGS. 1B-1C, is at voltage (Voff), e.g. −3.4V and as a result, FET switch stack (100A) of FIG. 1A will be in a steady OFF state (i.e. open). However, the time to reach the steady state may be too long to meet stringent switching time requirements. If switch (Sg1) turns from the ON to the OFF state before reaching the steady state, as shown in FIG. 1C, there is still current (I2) flowing through resistor (Rd1) according to a time constant which is now substantially equal to (Rg1+Rd1)*Cg1. As a result, depending on the duration of the bypass switch window (Ts), the voltage at point (G), i.e. the gate terminal of transistor (T1), may snap back to a higher voltage (e.g. −1.8V), meaning that a longer time will be required for the switch stack to reach the steady OFF state.

In order to further clarify what was mentioned above, reference is made to FIG. 2, wherein curves (210, 220) represents the voltage at point G, i.e. the gate terminal of transistor (T1) of FIG. 1A, shown in FIGS. 1B-1C as a function of time and for two different bypass switch windows (Ts1, Ts2) respectively. Bypass switch window (Ts1) is shorter than bypass switch window (Ts2). Points (A, B) show the points where the voltage at point (G) is snapping back up due to the fact that the gate bypass switch has turned OFF before the FET switch stack reaches the steady state. As can be seen in FIG. 2, the snapping back of the voltage at point (A) is more pronounced than that of point (B). In other words, in order to reduce the snapback of the gate terminal voltage, a longer bypass switch window is required, and this may be in conflict with the above mentioned stringent switching speed requirements imposed by the RF circuits implementing FET switch stacks.

In view of the above, there is a need to a) improve switching speed in RF circuits, and b) avoid the gate terminal snapping back problem occurring in FET switch stacks when transitioning from ON to OFF, as described above.

SUMMARY

The disclosed methods and devices provide practical solutions to the above-mentioned problems.

According to a first aspect of the disclosure, a radio frequency (RF) field effect transistor (FET) switch stack is provided, comprising: a plurality of FET transistors arranged in a stacked configuration; one or more first drain-source resistors coupled across corresponding drain-source terminals of FET transistors of the plurality of FET transistors, and one or more drain-source bypass switch coupled across corresponding one or more first drain-source resistors.

According to a second aspect of the present disclosure, a method of improving a speed of transitioning a FET switch stack from an ON state to an OFF state, the FET switch stack including a plurality of FET transistors arranged in a stacked configuration, one or more drain-source resistors coupled across drain-source terminals of corresponding FET transistors of the plurality of FET transistors is disclosed, the method comprising: coupling one or more drain-source bypass switches across corresponding drain-source terminals of the plurality of FET transistors; transitioning the plurality of FET transistors from the ON state to the OFF state; closing the one or more drain-source bypass switches to bypass the one or more drain-sources resistors; and opening the one or more drain-source bypass switches after the FET switch stack reached a steady OFF state.

Further aspects of the disclosure are provided in the description, drawings and claims of the present application.

DESCRIPTION OF THE DRAWINGS

FIG. 4 shows an exemplary curve representing the variation of the gate terminal of a transistor within a switch stack vs. time, according to an embodiment of the present disclosure.

FIG. 6C shows exemplary timing diagrams according to an embodiment of the present disclosure.

DETAILED DESCRIPTION

Figure 3A:
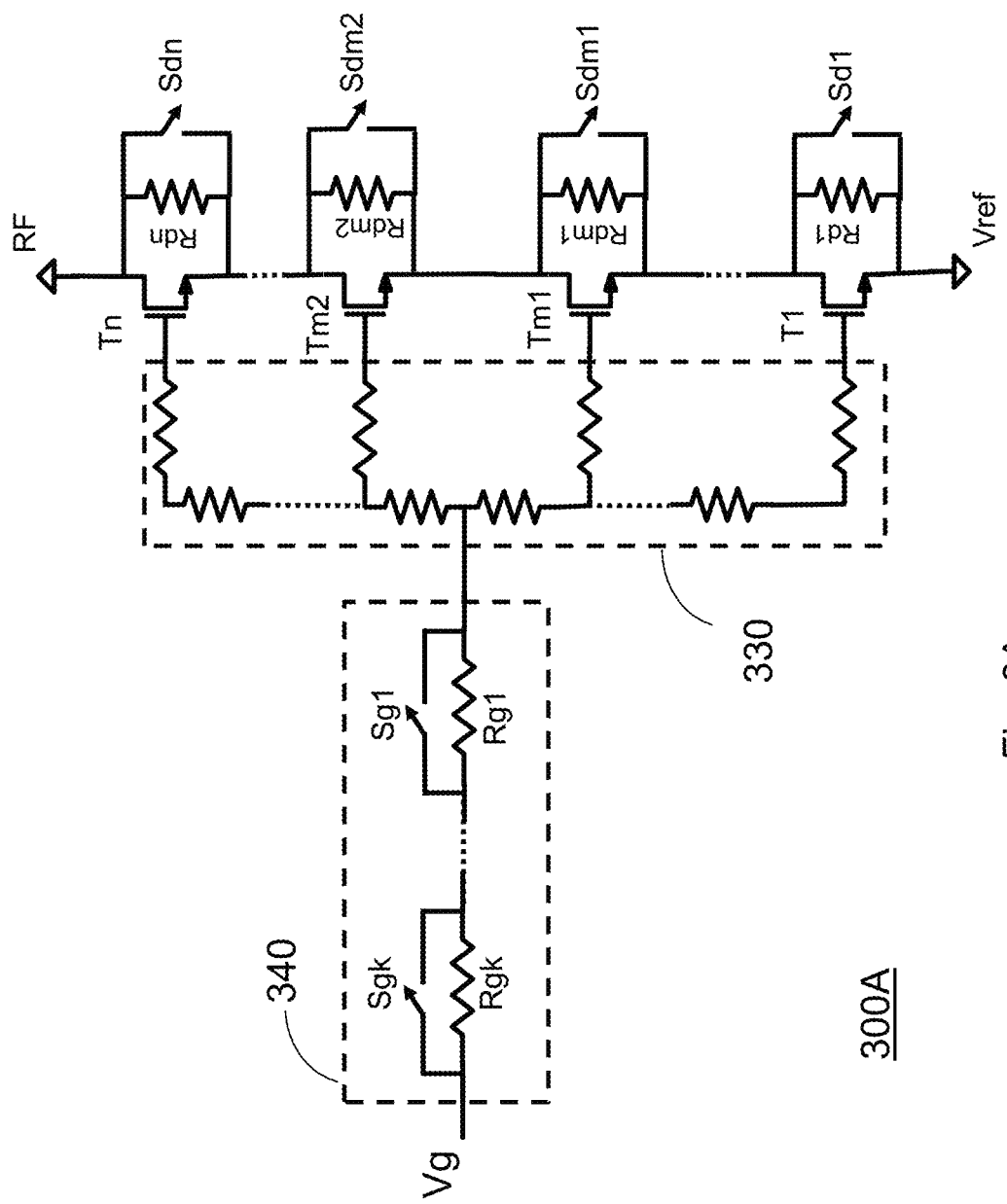
FIG. 3A shows an exemplary FET switch stack according to an embodiment of the present disclosure.

FIG. 3A shows an exemplary FET switch stack (300A) according to an embodiment of the present disclosure. FET switch stack (300A) comprises transistors (T1, ..., Tm1, Tm2, ..., Tn), drain-source resistors (Rd1, ..., Rdm1, Rdm2, ..., Rdn), common gate bypass switch (340) including gate resistors (Rg1, ..., Rgk) coupled across corresponding gate bypass switches (Sg1, ..., Sgk). Common gate bypass switch (340) is coupled to transistors (T1, ..., Tm1, Tm2, ..., Tn) via gate resistive network (330). Transistors (Rdm1, Rdm2) are adjacent transistors. FET switch stack (300A) further comprises drain-source bypass switches (Sd1, ..., Sdm1, Sdm2, ..., Sdn) coupled across corresponding drain-sources of transistors (T1, ..., Tm1, Tm2, ..., Tn). FET switch stack (300A) is coupled to RF input (RF) at one end and to reference voltage (Vref) at another end. Reference voltage (Vref) may be ground.

With continued reference to FIG. 3A, as mentioned previously, when FET switch stack (300A) is turning from the ON to the OFF state, drain-source resistors (Rd1, ..., Rdm1, Rdm2, ..., Rdn), are in the charging paths of corresponding gate capacitors (Cg1, ..., Cgm1, Cgm2, ..., Cgn) (not shown in the figure). The overall switching speed from the ON to OFF state will therefore depend on the RC time constant imposed by a combination of each drain-source resistor with its corresponding gate capacitor. In accordance with the teachings of the present disclosure, when FET switch stack (300A) is turning from the ON to the OFF state, drain-source bypass switches (Sd1, ..., Sdm1, Sdm2, ..., Sdn) are turned to the ON state (i.e. closed), thereby bypassing drain-source resistors (Rd1, ..., Rdm1, Rdm2, ..., Rdn). In other words the time constant of charging the gate capacitors of transistors (T1, ..., Tm1, Tm2, ..., Tn) is reduced, resulting in an improved overall switching speed as desired.

Figure 1A:
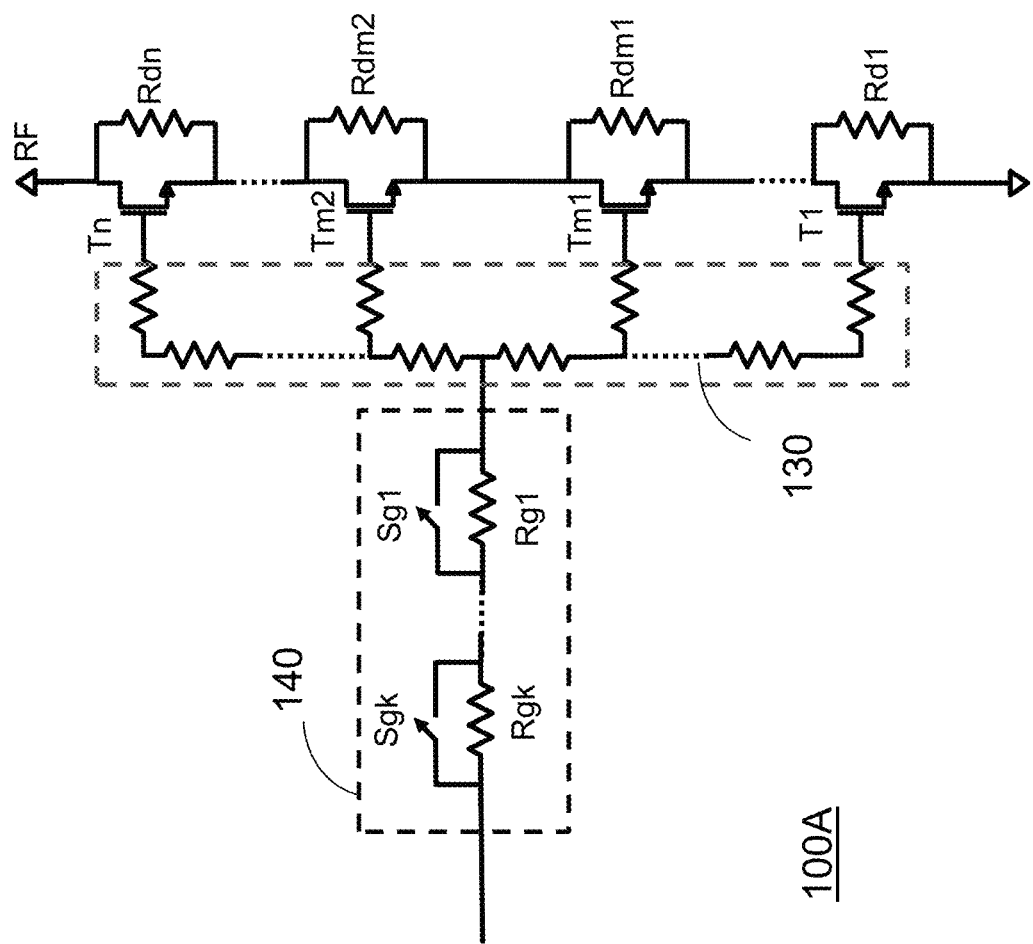
FIG. 1A shows a prior art FET switch stack.
Figure 1B:
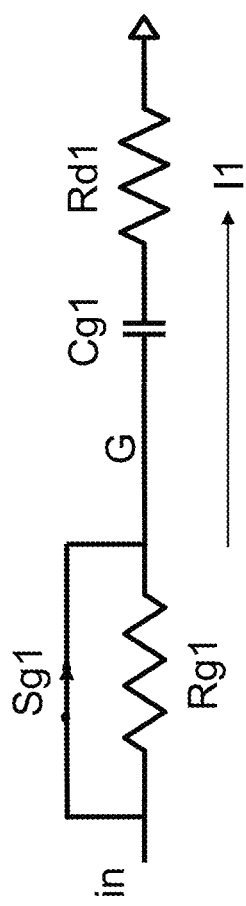
FIGS. 1B-1C show a representation of a simplified portion of the FET switch stack of FIG. 1A.
Figure 1C:
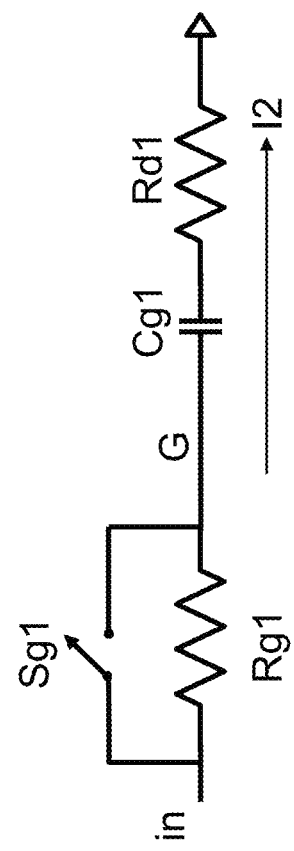
Figure 2:
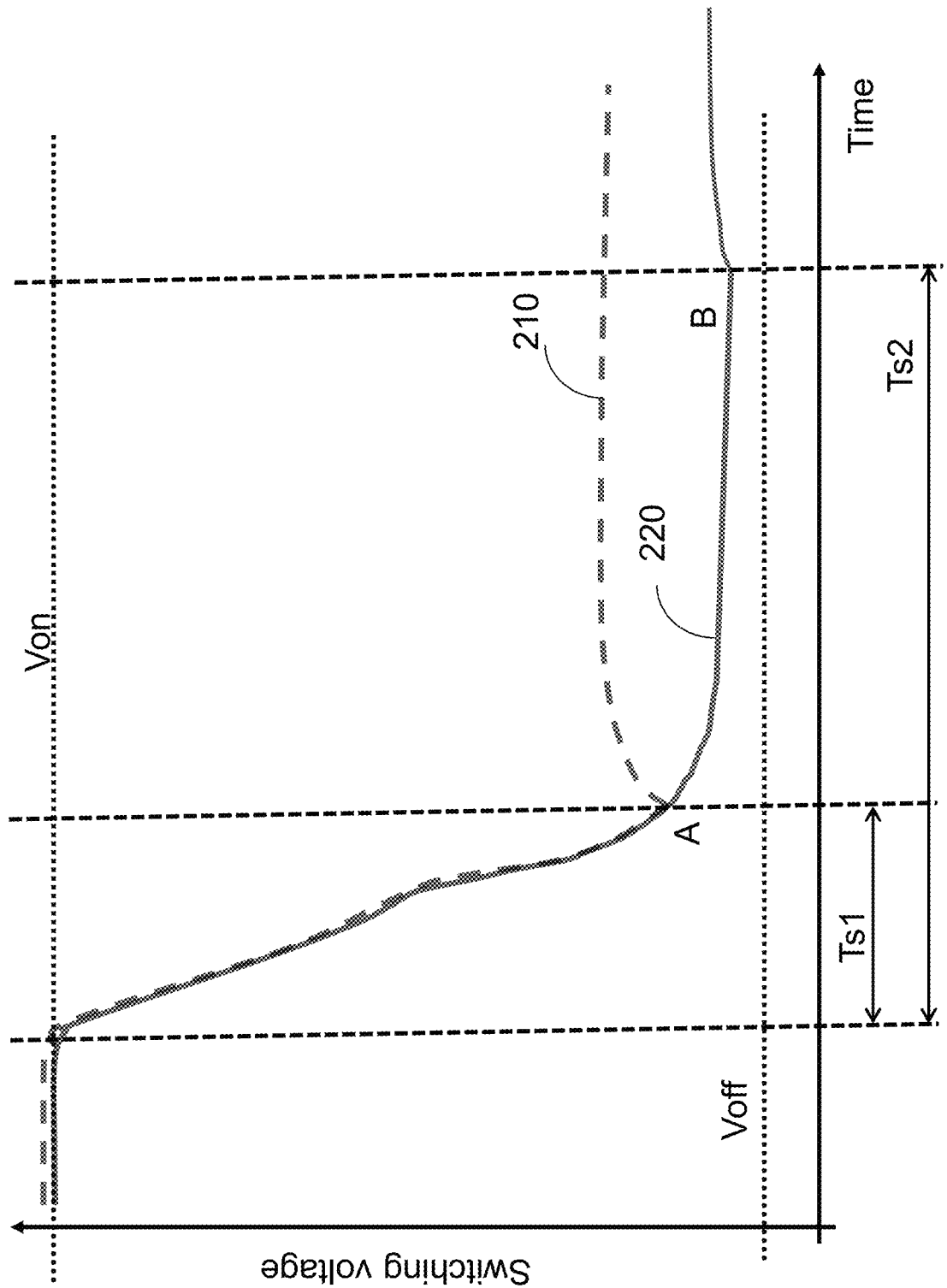
FIG. 2 shows curves representing the variation of the gate terminal voltage of a transistor within the switch stack of FIG. 1A vs. time.
Figure 3B:
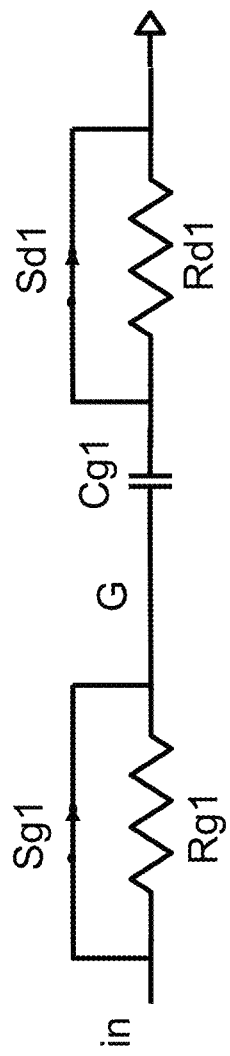
FIGS. 3B-3C show exemplary timing diagrams according to an embodiment of the present disclosure.
Figure 3C:
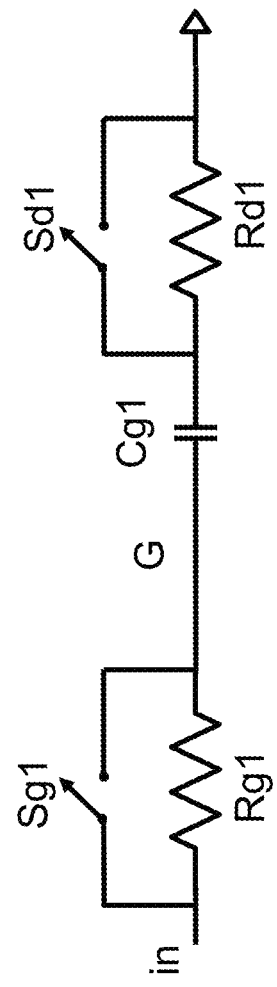

In order to further clarify the above-disclosed concept, reference is made to FIGS. 3B and 3C wherein, for the sake of simplicity, only transistor (T1) of FIG. 3A is shown. As shown in FIGS. 3B-3C, transistor (T1) is represented by its gate capacitor (Cg1) serially connected to the corresponding drain-source resistor (Rd1). In order to turn FET switch stack (300A) to an ON state, voltage (Von), e.g. 4V, is applied to input terminal (in), and to turn the transistor (T1) to an OFF state, voltage (Voff), e.g. −3.4V, is applied to input terminal (in). Similarly to what was described with regards to FIGS. 1B-1C, when transistor (T1) is transitioning from the ON to the OFF state, switch (Sg1) is in the ON state (i.e. closed) during a certain switching time window (Ts), as shown in FIG. 3B. On the other hand, and in contrast with what was described with regards to FIG. 1B, switch (Sd1) of FIG. 3B is also in the ON state (i.e. closed) during such transition, thereby bypassing drain-source resistor (Rd1) to accelerate the transition time and the time to reach the steady state. In other words, this time, gate capacitor (Cg1) will be charged faster than in FIG. 1B, resulting in a reduction of the time required to reach the steady state. As shown in FIG. 3C, once the steady state is reached, switch (Sd1) goes back to the OFF state (i.e. open) and as there is practically no current flowing through the resistors (Rg1, Rd1), no snapback effect will be observed in this case and the circuit will stay in its OFF steady state. This is further illustrated in FIG. 4 wherein the voltage of the gate terminal of transistor (T1), curve (450) is plotted vs. time. As can be seen, no snapback voltage effect is present by virtue of bypassing drain-source resistor (Rd1) during the transition from the ON to the OFF state of transistor (T1). Bypass switch windows (Ts1, Ts2) are also shown for a better comparison of FIG. 2 and FIG. 4.

With further reference to FIGS. 3B-3C the duration of the bypassing switch window for the switches (Rd1, Rg1) is the same in a preferred embodiment, although other embodiments implementing different durations of the bypass switch windows for such resistors may also be envisaged.

Figure 5A:
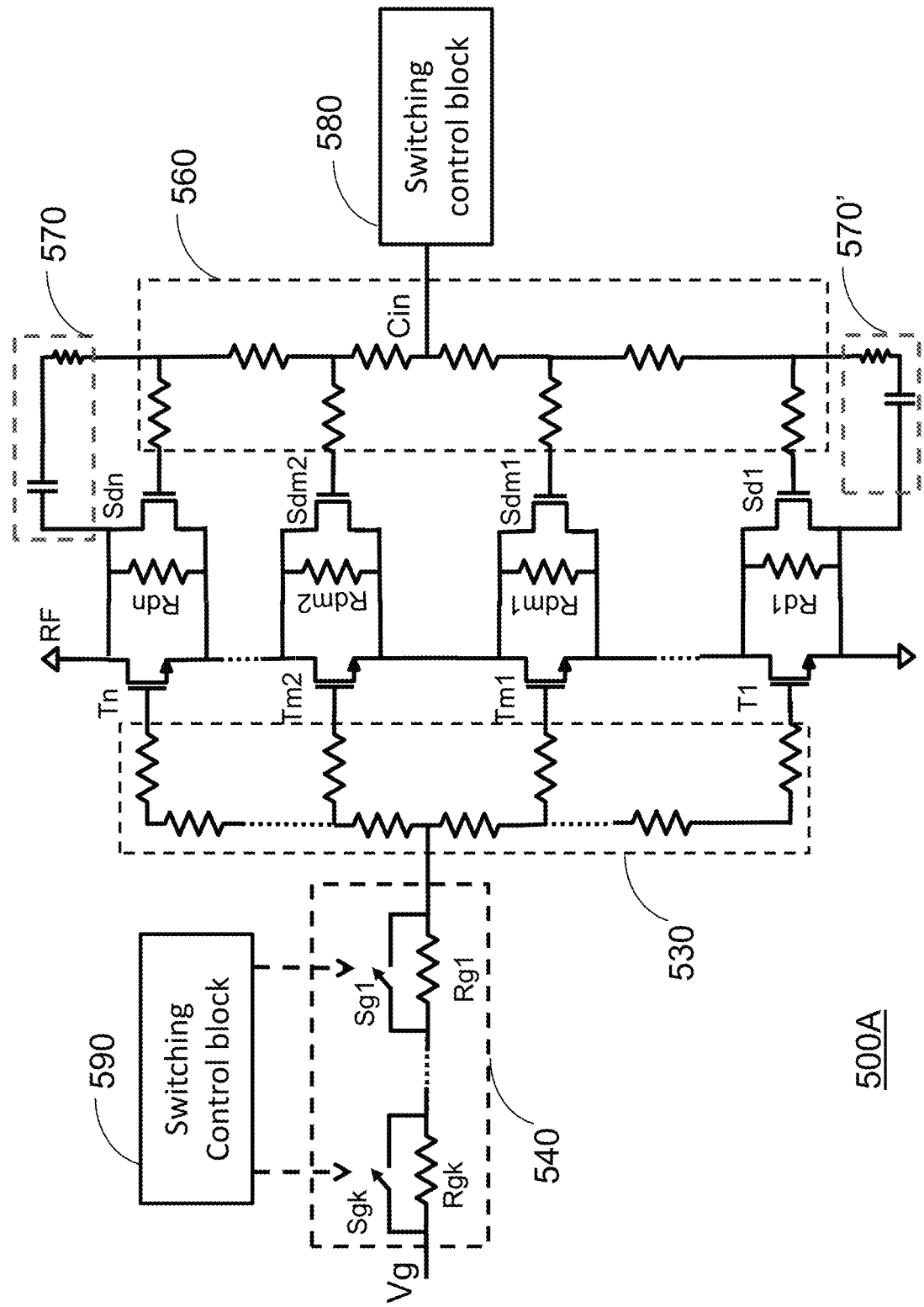
FIG. 5A shows an exemplary FET switch stack according to another embodiment of the present disclosure.

FIG. 5A shows an exemplary FET switch stack (500A) according to an embodiment of the present disclosure. The principle of operation of FET switch stack (500A) is similar to what was described with regards to FET switch stack (300A) of FIG. 3A, where additional implementation details are now shown in FIG. 5A. As shown in FIG. 5A, bypass drain-source switches (Sd1, ..., Sdm1, Sdm2, ..., Sdn) may be implemented using FETs (e.g. PMOS or NMOS FETs). Additionally, switch FET stack (500A) is configured to receive, at node (Cin), switching control signals from a first switching control block (580) to control the states of bypass drain-source switches (Sd1, ..., Sdm1, Sdm2, ..., Sdn) during operation. As also shown in FIG. 5A, first switching control block (580) may be coupled to bypass drain-source switches (Sd1, ..., Sdm1, Sdm2, ..., Sdn) through a first resistive network (560). Moreover, FET switch stack (500A) is further configured to receive switching control signals from a second switching control block (590) to control the state of gate bypass switches (Sg1, ..., Sgk) during operation. According to an embodiment of the present disclosure, optional RC elements (570, 570') may be implemented for a proper division of RF voltage across FET switch stack (500A). According to further embodiments of the present disclosure, one or more switches of the bypass drain-source switches (Sd1, ..., Sdm1, Sdm2, . . . , Sdn) can include a series arrangement of two or more switches (e.g. a switch stack two or more transistors arranged in series).

Figure 5B:
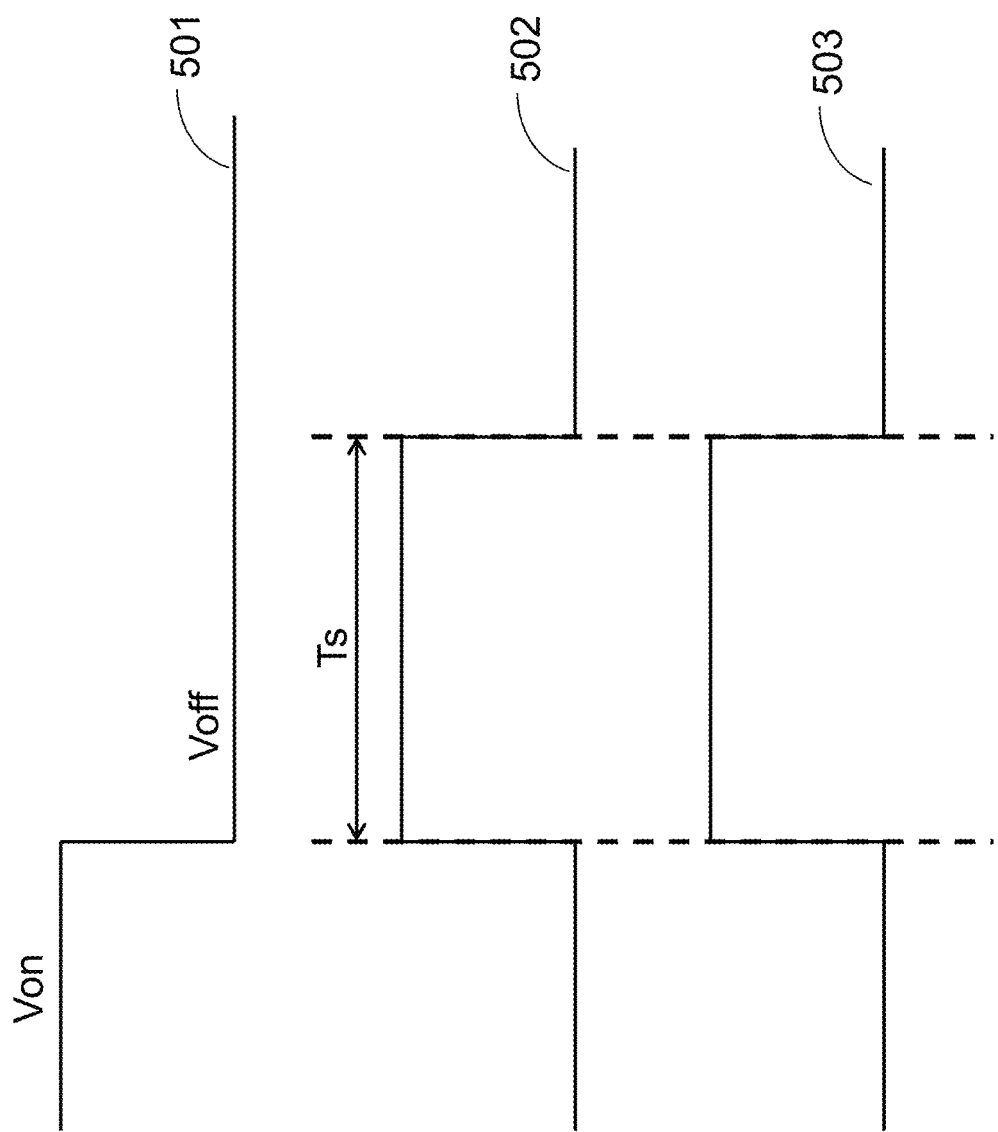
FIG. 5B shows exemplary timing diagrams according to an embodiment of the present disclosure.

FIG. 5B shows exemplary timing diagrams related to FET switch stack (500A) when in operative conditions. Timing diagram (501) represents the voltage values of the input voltage (Vg) of FIG. 5A when FET switch stack (500A) transitions from ON to OFF state. As shown in FIG. 5B, (Von, Voff) represents the voltage applied during the (ON, OFF) states respectively. Exemplary values for (Von, Voff) are (4V, −3.4V) respectively. Control signal (502) represents the control signal applied to node (Cin) of FET switch stack (500A) of FIG. 5A, to control the drain-source bypass switches (Sd1, . . . , Sdm1, Sdm2, . . . , Sdn) by the first switching control block (580). Control signal (503) represents the control signal applied to gate bypass switches (Sg1, . . . , Sgk) by second switching control block (590). As also shown, control signals (502, 503) may be pulses with the same duration (Ts) chosen based on the switching speed requirements. In this particular example, the duration of the two control pulses is the same, although control pulses with different durations may also be implemented. In the timing diagrams shown, pulse control signals (502, 503) are inverted versions of each other, indicating that the bypass drain-source and bypass gate switches may be implemented with different polarities (e.g. NMOS and PMOS). However, implementations of such bypass switches using the same polarity (both NMOS, or both PMOS) may also be envisaged.

Figure 5C:
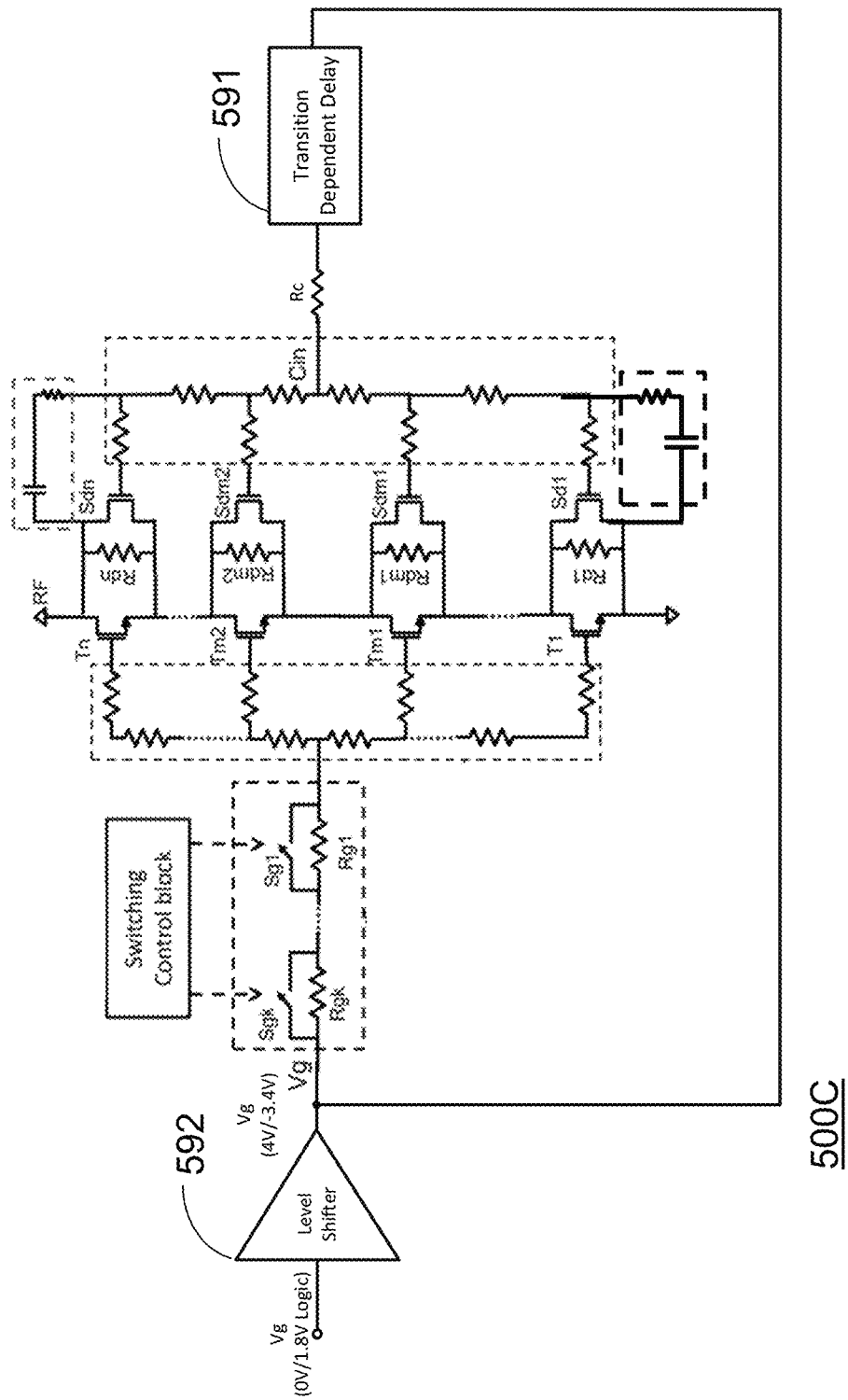
FIG. 5C shows an exemplary FET switch stack according to another embodiment of the present disclosure.
Figure 5D:
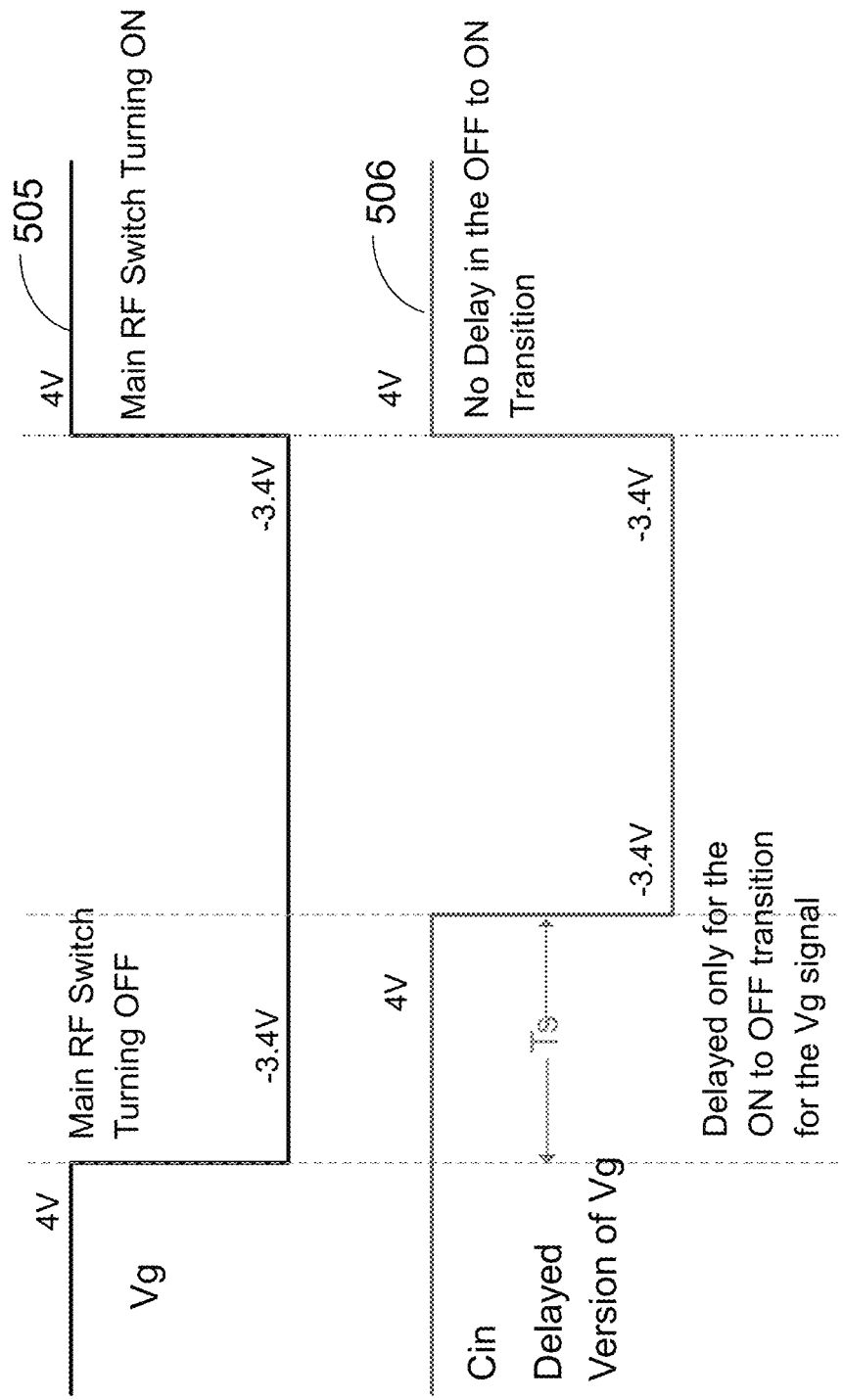
FIG. 5D shows exemplary timing diagrams according to an embodiment of the present disclosure.

FIG. 5C shows an exemplary FET switch stack (500C) according to an embodiment of the present disclosure. The principle of operation of FET switch stack (500C) is similar to what was described with regards to FET switch stack (500A) of FIG. 5A except that level shifter (592) and transition dependent delay block (591) are also added to further reduce the complexity of implementing the control circuitry. Transition dependent delay block (591) is coupled to node (Cin) through resistor (Rc). FIG. 5D shows exemplary timing diagrams related to FET switch stack (500C) of FIG. 5C when in operative conditions. Timing diagram (505) represents the voltage values of voltage (Vg) of FIG. 5C at output of level shifter (592). Timing diagram (506) represents the voltage values at node (Cin).

With further reference to FIGS. 5C-5D, drain-source bypass switches (Sd1, . . . , Sdm1, Sdm2, . . . , Sdn) stay ON when transistors (T1, . . . , Tm1, Tm2, . . . , Tn) are in ON state. According to the teachings of the present disclosure, resistor (Rc) may have a large enough resistance to prevent any possible RF leakage from the circuitry on the left hand side of node (Cin) to the transition dependent delay block (591). As shown by timing diagram (506) the voltage at node (Cin) is a delayed version (FIG. 5D: the delay amount is shown as Ts) of voltage (Vg) at the output of level shifter (505). In order words during the transition from ON to OFF of transistors (T1, . . . , Tm1, Tm2, . . . , Tn), the bypass switches (Sd1, . . . , Sdm1, Sdm2, . . . , Sdn) remain ON during time duration (Ts), and then they turn OFF. However, bypass switches (Sd1, . . . , Sdm1, Sdm2, . . . , Sdn) turn from OFF to ON state as soon as the transistors (T1, . . . , Tm1, Tm2, . . . , Tn) transition from OFF to ON state.

In what follows, exemplary embodiments representing different implementations of first and/or second switching control blocks (580, 590) will be described in detail.

Figure 6A:
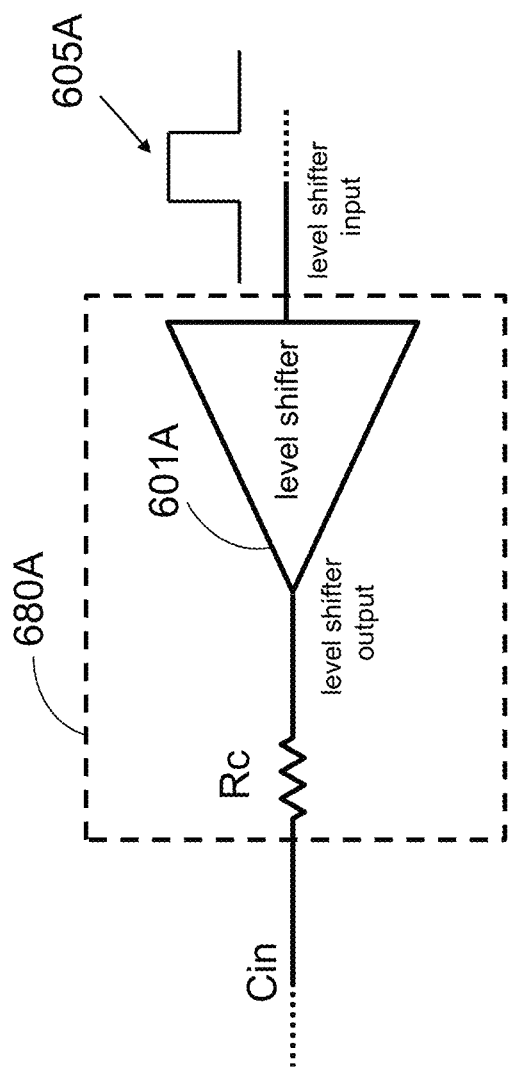
FIGS. 6A-6B, show exemplary switching control circuits according to embodiments of the present disclosure.

FIG. 6A shows an exemplary switching control block (680A) according to the teachings of the present disclosure. Switching control block (680A) represents an exemplary implementation of switching control block (580) of FIG. 5A.

As shown in the embodiment of FIG. 6A, switching control block (680A) comprises a level shifter (601A) serially connected to a resistor (Rc). Level shifter (601A) is configured to receive input control pulse (605A), while the output of level shifter (601A) is coupled to node (Cin) through resistor (Rc). Node (Cin), is the same as shown in FIG. 5A), where the control signals to control drain-source bypass switches (Sd1, . . . , Sdm1, Sdm2, . . . , Sdn) of FIG. 5A are applied.

With continued reference to FIG. 6A, level shifter (601A) is optional and used to adjust the amplitude levels of input control pulse (605A) to the levels required by FET switch stack (500A) of FIG. 5A. For example, the amplitude levels of input control pulse (605A) may be 0V and 1.6V while the amplitude levels of the control signals delivered at node (Cin) may be −3.4V and 4V as adjusted by level shifter (601A). The resistance value of resistor (Rc) may be chosen based on switching speed requirements. As an example, smaller resistance values may be chosen for faster switching speed requirements. On the other hand, given that the output of the level shifter (601A) is AC ground, choosing a smaller resistor may result in higher currents into the level shifter which may not be desired. As will be seen in the next presented embodiments, a larger resistor may still be used, however in order to overcome the undesired impact of the large resistor on the switching speed, such large resistor may be bypassed by a switch for a short period of time. This will overcome the tradeoff involved in the choice of the resistor as described above.

Figure 6B:
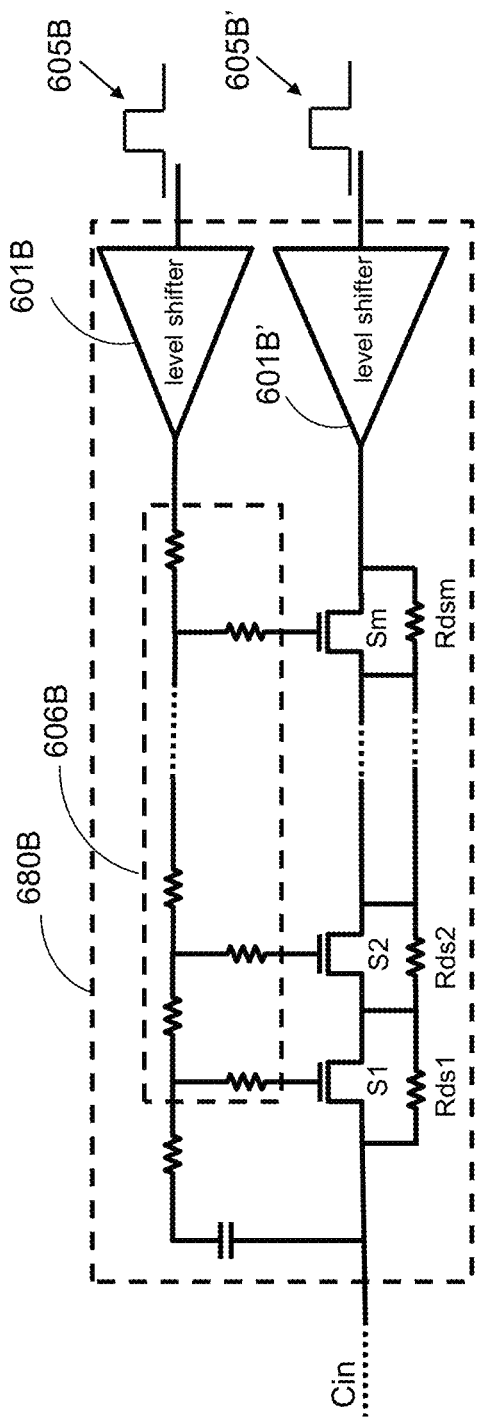

FIG. 6B shows an exemplary switching control block (680B) in accordance with embodiments of the present disclosure. Switching control block (680B) represents an exemplary implementation of switching control block (580) of FIG. 5A. As shown, switching control block (680B) comprises a first level shifter (601B) and a second level shifter (601B'). Level shifters (601B, 601B') are configured to receive control pulses (605B, 605B') respectively. Switching control block (680B) further comprises a plurality of switches (S1, . . . , Sm) arranged in a stack configuration and coupling the outputs of level shifter (601B') to node (Cin) of FET switch stack (500A) of FIG. 5A, thereby providing the control signal to the drain-source bypass switches (Sd1, . . . , Sdm1, Sdm2, . . . , Sdn) of FIG. 5A. Level shifter (601B) may be coupled to the gate terminals of switches (S1, . . . , Sm) via resistive network (606B). Switching control block (680B) further comprises a plurality of resistors (Rds1, . . . , Rdsm) coupled across drain-source terminals of corresponding switches of the switches (S1, . . . , Sm).

With continued reference to FIG. 6B, the series combination of the plurality of resistors (Rds1, . . . , Rdsm) provides a larger resistance between the output of level shifter (601B') and node (Cin), thereby preventing undesired larger currents from passing through level shifter (601B') when switches (S1, . . . , Sm) are in the OFF state. In addition, when FET switch stack (500A) of FIG. 5A is transitioning from the ON to the OFF state, the plurality of switches (S1, . . . , Sm) will remain ON to bypass the drain-source resistors (Rds1, . . . , Rdsm). As such, the control pulse (605B') will be applied to node (Cin) and rest of the circuit within FET switch stack (500A) of FIG. 5A, experiencing a smaller time constant. As a result, the overall switching speed of FET switch stack (500A) of FIG. 5A will be improved.

In order to further clarify the points made above, reference is made to FIG. 6C showing exemplary timing diagrams with the reference to the embodiment of FIG. 6B in accordance with the teachings of the present disclosure.

Timing diagram (601C) represents the voltage values of the input voltage (Vg) of FIG. 5A vs. time, when FET switch stack (500A) transitions from the ON to the OFF state. Voltage levels (Von, Voff) represents the voltage applied during the (ON, OFF) states respectively. Exemplary values for (Von, Voff) are (4V, −3.4V).

With further reference to FIG. 6C, control pulse (603C) represents the control signal, applied by level shifter (601B'), to node (Cin) of FET switch stack (500A) of FIG. 5A to the control drain-source bypass switches (Sd1, . . . , Sdm1, Sdm2, . . . , Sdn). On the other hand, control pulse (602C) represents the control signal applied to the gate bypass switches (Sg1, . . . , Sgk) by the second switching control block (590) of FIG. 5A. As also shown, control pulses (602C, 603C) are pulses with the same duration (Ts) chosen based on switching speed requirements. In this particular exemplary embodiment, the durations of the two control pulses are the same, although control pulses with different durations may also be implemented. In the timing diagram shown in FIG. 6C, pulse controls (602C, 603C) are inverted versions of each other, indicating that the bypass drain-source and the bypass gate switches are implemented with different polarities (e.g. NMOS and PMOS). However, implementations of such bypass switches using the same polarity (both NMOS, or both PMOS) may also be envisaged.

With continued reference to FIG. 6C, control pulse (604C) is the control signal, applied by level shifter (601B) to the gate terminals of the plurality of switches (S1, . . . , Sm) through resistive network (606B), see also FIG. 6B.

In accordance with the teachings of the present disclosure, during time interval (To) shown in FIG. 6B, switch FET stack (500A) of FIG. 5A is in an ON state (i.e. closed), and the plurality of switches (S1, . . . , Sm) of FIG. 6B are in an OFF state (i.e. open). As such, the impedance seen at node (Cin) into the input of level shifter (601B') of FIG. 6B is substantially equivalent to the series combination of the plurality of drain-source resistors (Rds1, . . . , Rdsm) and as a result, no excessive current will be experienced by the level shifter output.

On the other hand, during time interval (Ts) shown in FIG. 6B, FET switch stack (500A) of FIG. 5A is transitioning from ON to OFF and the plurality of switches (S1, . . . , Sm) of FIG. 6B are in an ON state, bypassing the drain-source resistors (Rd1, . . . , Rdm). As such, the pulse applied to node (Cin) will experience a smaller time constant to reach the FET switch stack (500A) circuitry. During the same time interval (Ts), the drain-source bypass switches (Sd1, . . . , Sdm1, Sdm2, . . . , Sdn) of FIG. 5A will turn to an ON state, thereby bypassing the drain-source resistors (Rd1, . . . , Rdm1, Rdm2, . . . , Rdn) of FET switch stack (500A) of FIG. 5A, such that an improved switching speed is achieved by turning FET switch stack (500A) to the OFF state in a shorter time. As mentioned previously, the length of the time interval (Ts) may be chosen based on switching speed requirements. During such time interval, FET switch stack (500A) has enough time to switch to a steady OFF state. According to embodiments of the present disclosure, in order to further assure that a steady OFF state of FET switch stack (500A) is achieved, control pulse (604C) of FIG. 6C may go LOW for a short time interval (Td), e.g. 200 nsec, before turning back up. During time interval (Td), the plurality of switches (S1, . . . , Sm) of FIG. 6B are still in an ON state before turning to the OFF state after time interval (Td) has lapsed. According to an embodiment of the present disclosure, the amplitude levels at the output of level shifter (601B) of FIG. 6B may be 0V, −3.4V, or equal to the voltage of an internal power supply.

Figure 6D:
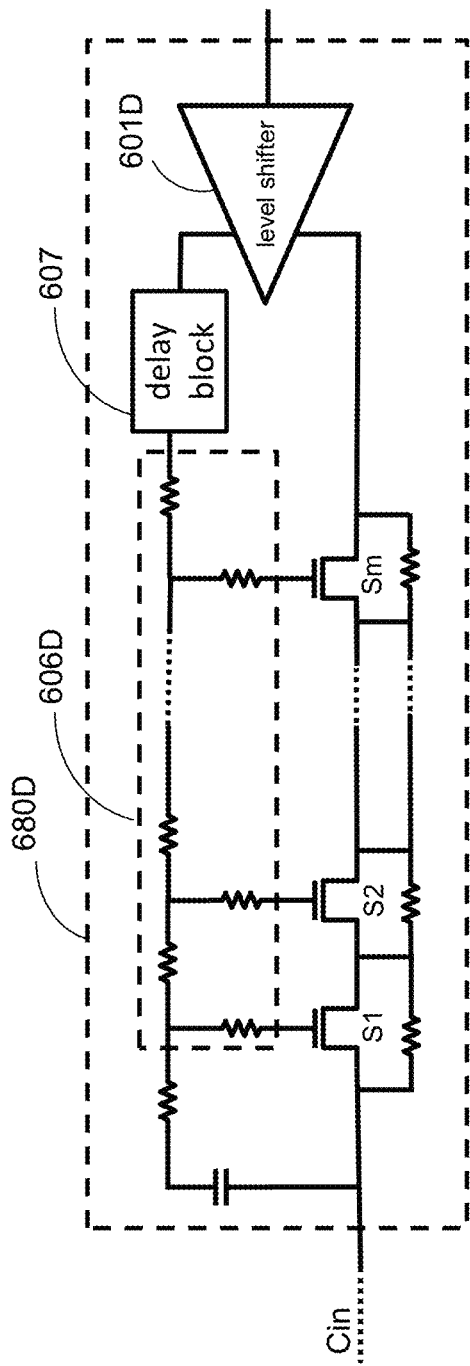
FIG. 6D shows an exemplary switching control circuit according to embodiments of the present disclosure.

FIG. 6D shows an exemplary switching control block (680D) in accordance with further embodiments of the present disclosure. Switching control block (680D) represents another exemplary implementation of switching control block (580) of FIG. 5A. The principle of operation of switching control block (680D) is similar to what was described with regards to switching control block (680B) of FIG. 6B, except that, instead of two level shifters, switching control block (680D) makes use of a single level shifter (601D) with two outputs, one coupled to the plurality of switches (S1, . . . , Sm) and the other one being coupled to resistive network (606D) via delay block (607). By way of example, the two outputs of level shifter (601D) may be the inverted versions of each other.

Figure 6E:
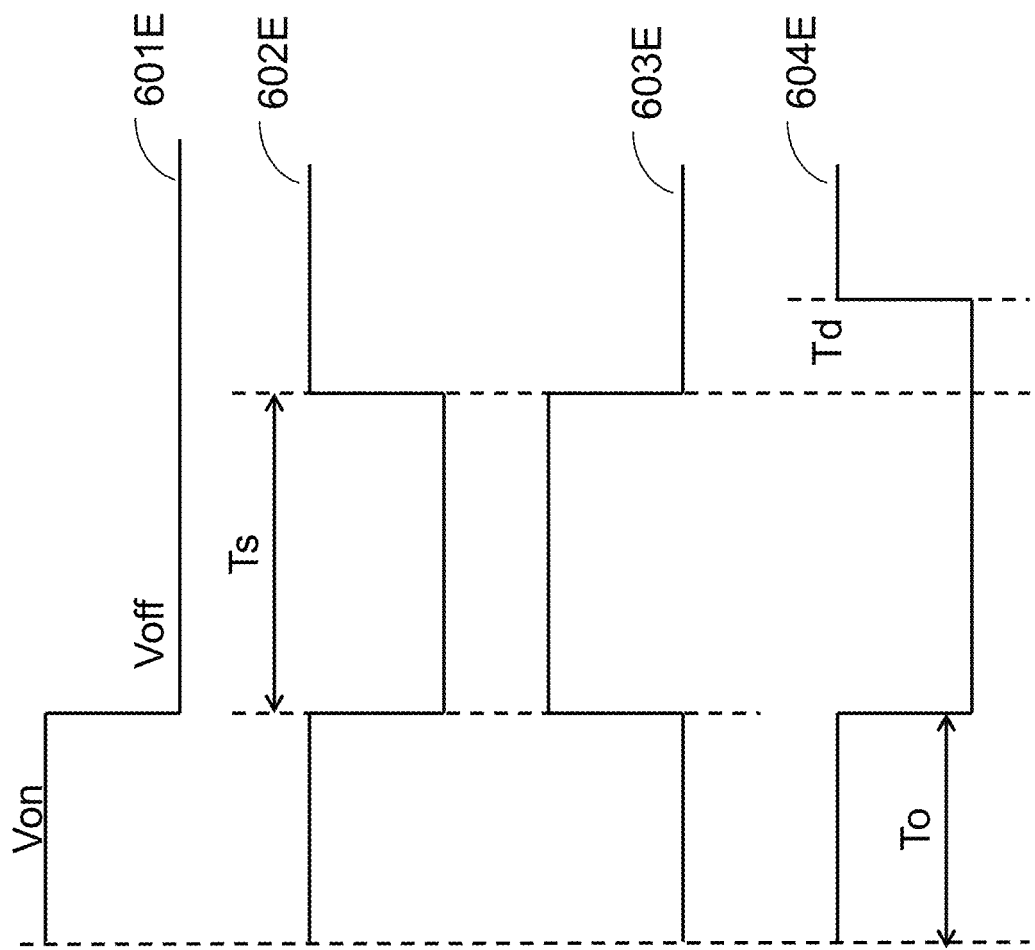
FIG. 6E shows exemplary timing diagrams according to an embodiment of the present disclosure.

FIG. 6E shows timing diagrams related to the switching control block (680D) of FIG. 6D. The description of elements (601E, 602E, 603E) is similar to that of their counterparts (601C, 602C, 603C) of FIG. 6C. As also shown in FIG. 6E, pulse control (604E) also goes LOW when FET switch stack (500A) of FIG. 5A starts transitioning from the ON to the OFF state. In particular, pulse control (604E) stays LOW until a steady OFF state of switching control block (580) of FIG. 5A is achieved. The additional time interval (Td) during which pulse control (604E) continues to stay LOW is due to the presence of the delay block (607) of FIG. 6D. Exemplary amplitude levels at the outputs of the level shifter (601D) of FIG. 6D may be 0V, −3.4V and, for this particular example, NMOS transistors may be used to implement the drain-source bypass switches (Sd1, . . . , Sdm1, Sdm2, . . . , Sdn) of FIG. 5A.

With reference now to the various embodiments of the present disclosure, although the drain-source bypass switches (Sd1, . . . , Sdm1, Sdm2, . . . , Sdn) have been represented so far as physically distinct and separate from the respective transistors (T1, . . . , Tm1, Tm2, . . . , Tn), embodiments are also possible where such switches are part of those transistors.

Figure 7A:
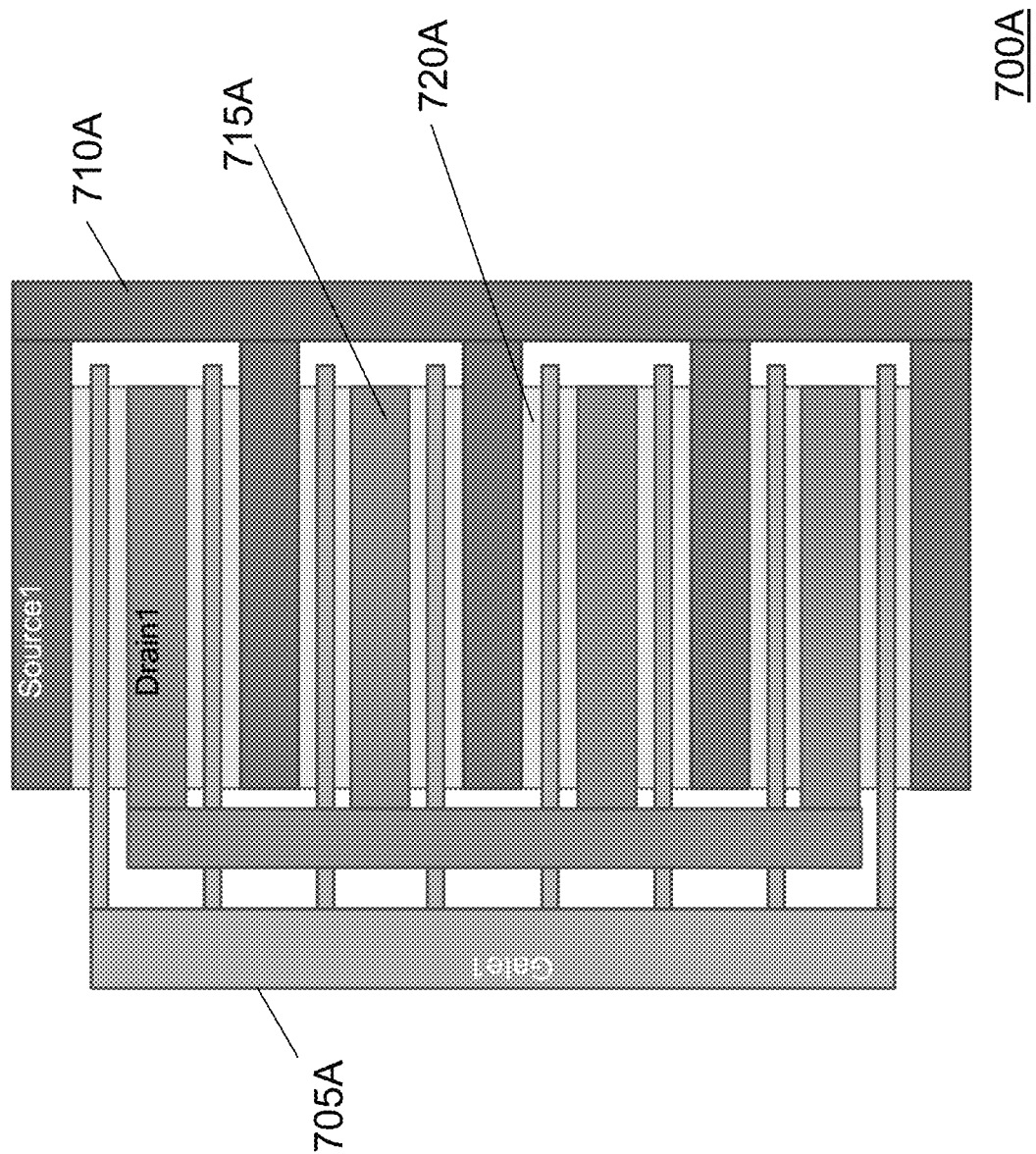
FIGS. 7A-7B show exemplary layouts of transistors according to embodiments of the present disclosure.

Reference is initially made the layout of FIG. 7A, which shows an exemplary layout of a transistor (700A) (e.g. Tm1) in accordance with the embodiment of FIG. 5A, such transistor comprising a multi-finger gate region (705A), a multi-finger source region (710A), a multi-finger drain region (715A) and a common channel region (720A).

Figure 7B:
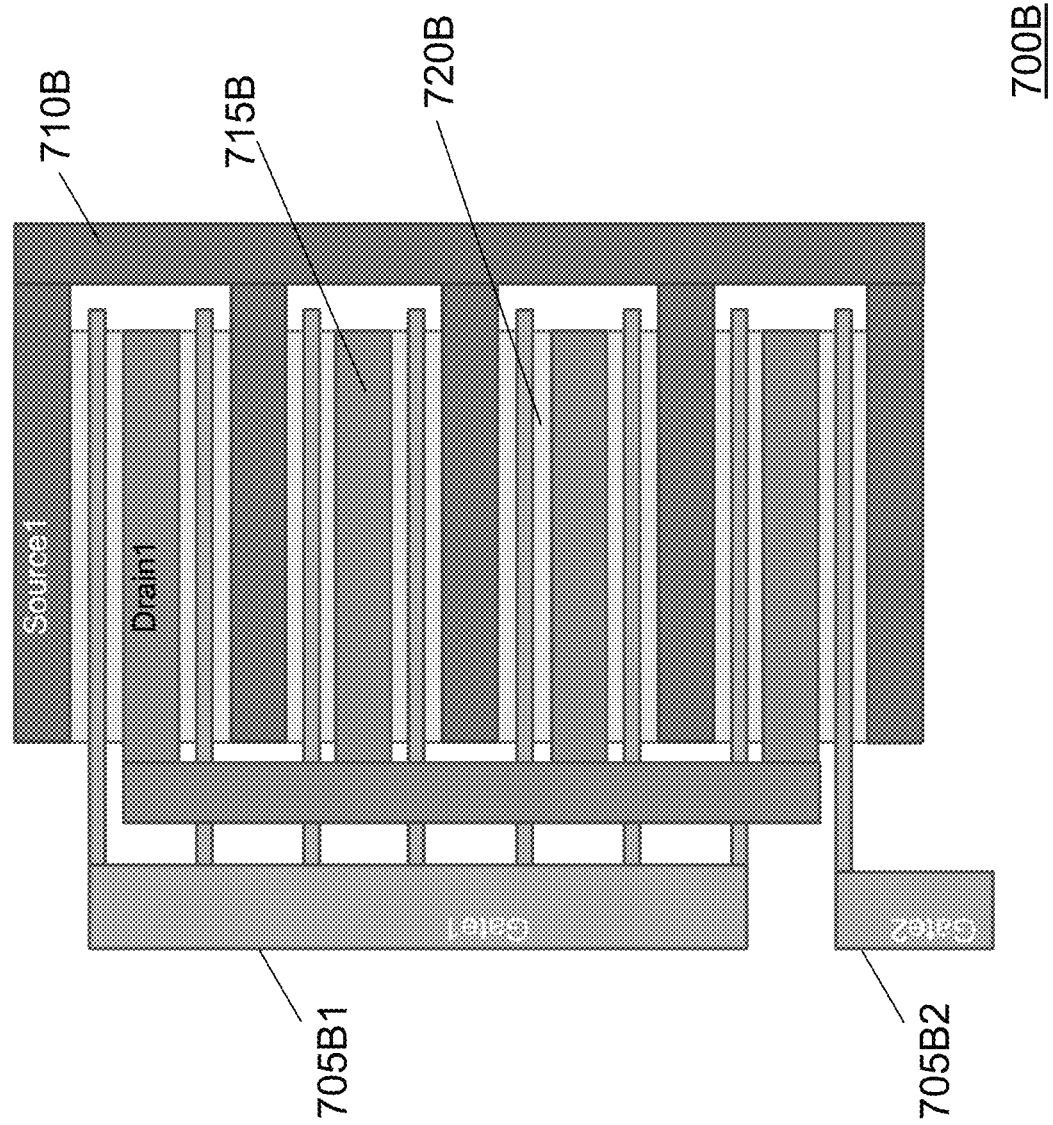

According to a further embodiment of the present disclosure, the functionality of the respective drain-source bypass switch can be implemented as part of the same transistor (Tm1) as shown in the layout of FIG. 7B (in this case Sdm2), where multi-finger source region (710B), multi-finger drain region (715B) and common channel region (720B) are shown and where the gate region is partitioned into a first gate region (705B1) and a second gate region (705B2) is associated with Sdm2.

A number of embodiments of the invention have been described. It is to be understood that various modifications may be made without departing from the spirit and scope of the invention. For example, some of the steps described above, if any, may be order independent, and thus can be performed in an order different from that described. Further, some of the steps described above, if any, may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. If parenthetical labels for claim elements are used, they are for ease of referring to such elements, and do not in themselves indicate a particular required ordering or enumeration of elements; further, such labels may be reused in dependent claims as references to additional elements without being regarded as starting a conflicting labeling sequence.

As should be readily apparent to one of ordinary skill in the art, various embodiments of the invention can be implemented to meet a wide variety of specifications. Unless otherwise noted above, selection of suitable stack values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. The term "MOSFET" technically refers to metal-oxide-semiconductor FET; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductor FET, but instead includes IGFETs in general. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 100 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Stack voltage, current, and power handling capabilities may be adapted as needed, for example, by adjusting device sizes, serially "stacking" stacks (particularly FETs) to withstand greater voltages, and/or using multiple stacks in parallel to handle greater currents. Additional circuit stacks may be added to enhance the capabilities of the disclosed circuits and/or to provide additional functional without significantly altering the functionality of the disclosed circuits.

The invention claimed is:

1. A radio frequency (RF) field effect transistor (FET) switch stack comprising:
   FET transistors arranged in a stacked configuration;
   one or more first drain-source resistors, each first drain-source resistor coupled across drain-source terminals of a corresponding FET transistor of the FET transistors;
   one or more drain-source bypass switches, each drain-source bypass switch coupled across corresponding one or more first drain-source resistors; and
   a switching control block configured to control the drain-source bypass switches, the switching control block comprising one or more FET control switches configured to be in a control switch OFF state when the FET transistors are in a stack OFF state or a stack ON state and to be in a control switch ON state when the FET transistors are transitioning from the stack ON state to the stack OFF state.

2. The RF FET switch stack of claim 1, wherein the switching control block further comprises one or more second drain-source resistors coupled across corresponding one or more FET control switches.

3. The RF FET switch stack of claim 1, configured to receive a control voltage applied at an input terminal, the control voltage being configured to transition the RF FET switch stack from the stack OFF state to the stack ON state and vice versa.

4. The RF FET switch stack of claim 3, further comprising a gate bypass circuit coupling the input terminal to gate terminals of the FET transistors and gate resistors between the gate bypass circuit and corresponding gate terminals of the FET transistors, the gate bypass circuit comprising:
   gate bypass switches arranged in a stacked configuration and coupling the input terminal to the gate terminals of the FET transistors;
   wherein the gate bypass switches are configured to be in
   a gate bypass switch OFF state when the RF FET switch stack is in the stack OFF state or in the stack ON state, and
   a gate bypass switch ON state when the RF FET switch stack is transitioning from the stack ON state to the stack OFF state, thereby bypassing the gate resistors.

5. The RF FET switch stack of claim 1, the FET switch stack being coupled to an RF input at one end and to a reference voltage to another end.

6. A method for switching a radio frequency (RF) FET switch stack comprising FET transistors and drain-source bypass switches coupled across corresponding drains-sources of the FET transistors, and a switching control block configured to control the drain-source bypass switches, the switching control block comprising one or more FET control switches, the RF FET switch stack being configured to be in a stack ON state and in a stack OFF state, the drain-source bypass switches being configured to be in a drain-source bypass switch ON state and in a drain-source bypass switch OFF state, the method comprising:
   controlling the drain-source bypass switches;
   switching the FET control switches into a control switch OFF state when the FET transistors are in a stack OFF state or a stack ON state, and
   switch the FET control switches into a control switch ON state when the FET transistors are transitioning from the stack ON state to the stack OFF state.

7. The RF FET switch stack of claim 2, wherein:
   the switching control block comprises a series resistor, and
   the control block is configured to:
   generate a first control signal to turn the drain-source bypass switches from the drain-source bypass switch OFF state to the drain-source bypass switch ON state when the FET transistors are transitioning from the stack ON state to the stack OFF state, and feed the first control signal to the drain-source bypass switches through the series resistor.

8. A radio frequency (RF) field effect transistor (FET) switch stack comprising:
   FET transistors arranged in a stacked configuration;
   one or more first drain-source resistors, each first drain-source resistor coupled across drain-source terminals of a corresponding FET transistor of the FET transistors;
   one or more drain-source bypass switches, each drain-source bypass switch coupled across corresponding one or more first drain-source resistors;
   a switching control block configured to control the drain-source bypass switches, the switching control block comprising
   one or more FET control switches in a stacked configuration, and
   one or more second drain-source resistors coupled across corresponding one or more FET control switches;
   the one or more FET control switches being configured to be in a control switch OFF state when the FET transistors are in the stack OFF state or the stack ON state and to be in a control switch ON state when the FET transistors are transitioning from the stack ON state to the stack OFF state, thereby bypassing the one or more second drain-source resistors; and
   the switching control block being configured to:
   generate a first control signal to turn the drain-source bypass switches from the drain-source bypass switch OFF state to the drain-source bypass switch ON state when the FET transistors are transitioning from the stack ON state to the stack OFF state, and
   couple the first control signal to the drain-source bypass switches through the one or more FET control switches.

9. The RF FET switch stack of claim 8, wherein the switching control block is configured to
   generate a second control signal and,
   when the FET transistors are transitioning from the stack ON state to the stack OFF state, to couple the second control signal to gate terminals of the one or more FET control switches, thereby turning the one or more FET control switches from the control switch OFF state to the control switch ON state.

10. The RF FET switch stack of claim 9, wherein the first control signal has a first control signal duration selected based on a desired switching speed of the RF FET switch stack.

11. The RF FET switch stack of claim 10, wherein the first control signal and the second control signal are staggered in time and wherein the second control signal has a second control signal duration shorter than the first control signal duration.

12. The RF FET switch stack of claim 10, wherein the first control signal and the second control signal start at the same time and wherein the second control signal has a second control signal duration longer than the first control signal duration.

13. The RF FET switch stack of claim 11, wherein:
   the switching control block further comprises a first level shifter and a second level shifter;
   the first level shifter is configured to receive and to level shift a first input signal to generate the first control signal, and
   the second level shifter is configured to receive and level shift a second input signal to generate the second control signal.

14. The RF FET switch stack of claim 13, wherein:
   the switching control block further comprises a delay element in series with a single level shifter, the single level shifter including a first level shifter output and a second level shifter output, the second level shifter output being an inverted version of the first level shifter output;
   the single level shifter is configured to receive an input control signal to generate i) the first control signal and ii) an inverted control signal; and
   the delay element is configured to delay the inverted control signal to generate the second control signal.

15. The RF FET switch stack of claim 4, configured to receive a first control signal to control the one or more drain-source bypass switches and to receive a second control signal to control the gate bypass switches.

16. The RF FET switch stack of claim 15, wherein the first control signal and the second control signal have same durations.

17. The RF FET switch stack of claim 15, wherein the first control signal is a delayed version of the second control signal.

18. The RF FET switch stack of claim 1, wherein the drain-source bypass switches comprise N-MOSFETS or P-MOSFETS.

19. The RF FET switch stack of claim 8, wherein the one or more FET control switches comprise P-MOSFETs and the drain-source bypass switches comprise N-MOSFETs.

\* \* \* \* \*